US007800206B2

(12) United States Patent  (10) Patent No.: US 7,800,206 B2
Urushihata  (45) Date of Patent:  Sep. 21, 2010

(54) SEMICONDUCTOR DEVICE

(75) Inventor: Hiroyoshi Urushihata, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 461 days.

(21) Appl. No.: 11/861,652

(22) Filed: Sep. 26, 2007

(65) Prior Publication Data

US 2008/0284008 A1  Nov. 20, 2008

(30) Foreign Application Priority Data

Apr. 16, 2007  (JP) ............................ 2007-107637

(51) Int. Cl.
  *H01L 23/495* (2006.01)
  *H01L 23/48* (2006.01)
(52) U.S. Cl. ...................... 257/676; 257/666; 257/784; 257/686; 257/E23.037
(58) Field of Classification Search ................. 257/676, 257/666, 784, 686, E23.037
  See application file for complete search history.

(56) References Cited

U.S. PATENT DOCUMENTS

| 5,897,339 | A | | 4/1999 | Song et al. | |
|---|---|---|---|---|---|
| 6,069,401 | A | * | 5/2000 | Nakamura et al. | 257/676 |
| 6,133,632 | A | * | 10/2000 | Davis et al. | 257/723 |
| 6,603,197 | B1 | * | 8/2003 | Yoshida et al. | 257/676 |
| 6,650,004 | B1 | * | 11/2003 | Horie et al. | 257/666 |
| 7,045,888 | B2 | * | 5/2006 | Tsai et al. | 257/686 |
| 2005/0110127 | A1 | * | 5/2005 | Kanemoto et al. | 257/686 |
| 2005/0285239 | A1 | * | 12/2005 | Tsai et al. | 257/676 |
| 2007/0228537 | A1 | * | 10/2007 | Inotsume et al. | 257/678 |

FOREIGN PATENT DOCUMENTS

| CN | 1176489 A | 3/1998 |
|---|---|---|
| JP | 2007-05569 | 1/2007 |

* cited by examiner

*Primary Examiner*—Nitin Parekh
(74) *Attorney, Agent, or Firm*—Fish & Richardson P.C.

(57) ABSTRACT

Provided is a semiconductor device which is small in size and in which the deformation of leads is prevented at the time of wire-bonding. The semiconductor device includes: an island; a semiconductor element mounted on the bottom surface of the island; leads provided close to the island; and a sealing resin for integrally sealing these constituents. Moreover, in the semiconductor device according to the present invention, electrodes on the semiconductor element are bonded to the leads provided adjacent to a side of the island, the side not provided with leads which extends continuously from the island.

4 Claims, 11 Drawing Sheets

SEMICONDUCTOR DEVICE

This invention claims priority from Japanese Patent Application Number JP 2007-107637 filed on Apr. 16, 2007, the content of which is incorporated herein by reference in its entirety.

BACKGROUND OF THE INVENTION

1. Field of the Invention

The present invention relates to a semiconductor device, and particularly to a semiconductor device provided with leads which bend in a thickness direction.

2. Description of the Related Art

Generally, a semiconductor device using a lead frame is provided with an island and multiple leads each having one end mounted around the island. On the top surface of the island, a semiconductor element is fixed, and bonding pads on the semiconductor element are bonded to the leads with thin metal wires. This technology is described, for instance, in Japanese Patent Application Publication No. 2007-5569. Furthermore, the island, the leads, the semiconductor element and the thin metal wires are sealed with an insulating resin so that the end portions of the leads may be exposed to the outside. Here, the portion of the lead sealed with the insulating resin is called an inner lead, and the portion of the lead exposed from the insulating resin is called an outer lead. The outer lead is bent as necessary, so that the other end of the lead is mounted on a printed board with solder, for example.

Moreover, a stacked semiconductor device is also fabricated by stacking multiple chips on an island. This is made by stacking a parent chip with a child chip smaller than the parent chip. The parent chip and also the child chip are electrically bonded with a thin metal wire.

With reference to FIG. 11A to 11C, description will be given specifically of a configuration and the like of a conventional semiconductor device 100. FIG. 11A is a plain view of the semiconductor device 100 as viewed from the above. FIG. 11B is a cross-sectional view of the semiconductor device 100 taken along the line B-B' of FIG. 11A. FIG. 11C is a cross-sectional view for describing a wire-bonding step.

As shown in FIG. 11A and FIG. 11B, the semiconductor device 100 includes: an island 104; leads 102A and the like; a semiconductor element 106 which is fixed to the bottom surface of the island 104; thin metal wires 108 which electrically bond the semiconductor element 106 to the leads 102A and the like; and a sealing resin 120 which integrally seals these constituents.

As shown in FIG. 11A, the island 104 is disposed on the center of the semiconductor device 100. In FIG. 11A, a lead 102B (suspension lead) is projected to the outside from a side surface on the upper side of the island 104, and a lead 102E is projected to the outside from a side surface on the lower side of the island 104.

Each one end of the lead 102A, a lead 102C, a lead 102D and a lead 102F is disposed around the island 104. Each other end thereof is projected to the outside from the sealing resin 120. The bottom surface of the one end of, for example, the lead 102A is bonded, via the thin metal wire 108, to an electrode on the semiconductor element 106 which is fixed to the bottom surface of the island 104.

As shown in FIG. 11B, the lead 102F includes a bonding portion 118, an exposure portion 114 and an inclined portion 116. The bottom surface of the bonding portion 118 is bonded to the thin metal wire 108. The end portion of the exposure portion 114 is exposed to the outside from the sealing resin 120. Both of the bonding portion 118 and the exposure portion 114 are connected to each other while sandwiching the inclined portion 116 configured to incline and extend therebetween. Such a configuration is also employed in other leads. Furthermore, the bonding portion 118 of the lead 102F is positioned on the same plane as the island 104.

By providing the lead 102F with the inclined portion 116 as described above, it is possible to dispose the semiconductor element 106 and the thin metal wire 108 in the space below the island 104, and thereby the entire device is made thin.

As shown in FIG. 1C, the thin metal wire 108 is formed by using a capillary 116. Specifically, firstly, the capillary 116 is moved to the electrode formed on the top surface of the semiconductor element 106 so as to bond the thin metal wire 108 to the electrode. Subsequently, the capillary 116 is moved to the top surface of the bonding portion 118, and the thin metal wire 108 is fixed thereto. Thereafter, the thin metal wire 108 is cut off.

However, as shown in FIG. 1C, when the thin metal wire 108 is bonded to the bonding portion 118 of the lead with the above-described configuration, there is a problem that it is difficult to perform the wire-bonding. Specifically, in order to bond the thin metal wire 108 to the top surface of the bonding portion 118 of the lead 102F, the thin metal wire 108 needs to be pressed and fixed to the top surface of the bonding portion 118 with the lower end of the capillary 116. Nevertheless, in order to reduce the size of the entire device, the area of the top surface of the bonding portion 118 is made small as compared to the width of the capillary 116. For this reason, when the capillary 116 is made to approach the bonding portion 118, the end portion on the right side of the capillary 116 is brought into contact with the inclined portion 116. Accordingly, there is a problem that the inclined portion 116 of the lead 102F is deformed by the contacting impact with the capillary 116.

Furthermore, the semiconductor device configured as described above can be reduced in size by the miniaturization technique in these days. However, the top surface of the child chip is disposed on a higher position above the surface of the island than that of the parent chip. Accordingly, there is a problem that the thickness of the semiconductor device, that is, the thickness of the package is increased, as the top portion of the thin metal wire is further elevated by bonding the thin metal wire to the top surface of the child chip.

SUMMARY OF THE INVENTION

For these reasons, an object of the present invention is to provide a semiconductor device which is small in size and in which the deformation of leads is prevented at the time of wire-bonding.

An aspect of the present invention is a semiconductor device as follows. The semiconductor device includes: a semiconductor element; and conductive members which are electrically bonded to the semiconductor element, and which have an exposure portion exposed to the outside. Some of the conductive members have: the exposure portion; a connecting portion on which the semiconductor element is mounted, and which is positioned on a plane different from where the exposure portion is positioned; and a continuous portion which makes the connecting portion and the exposure portion continuous. An electrode provided on the main surface of the semiconductor element is bonded to, via a bonding member, other conductive members disposed close to a side surface of the semiconductor element, the side surface being different from other side surfaces adjacent to the continuous portion.

Another aspect of the present invention is a semiconductor device as follows. The semiconductor device includes: a plurality of semiconductor elements disposed by stacking; and leads which are electrically bonded to the semiconductor elements, and part of each lead is exposed to the outside. The lead has: an exposure portion which is exposed to the outside; a bonding portion which is electrically bonded to the semiconductor elements, and which is positioned on a plane different from where the exposure portion is positioned; and a continuous portion which makes the bonding portion and the exposure portion continuous. The semiconductor device specifically includes: a first island having a first main surface and a second main surface; the first semiconductor element mounted on the first main surface of the first island; the first lead which is continuous from the first island, and which is exposed to the outside; a second island having a first main surface and a second main surface which are different from those of the first island; the second semiconductor element mounted on the first main surface of the second island; the second lead which is continuous from the second island, and which is exposed to the outside; and the third lead disposed close to a side surface of the semiconductor element, the side surface being different from other side surfaces where the first and second leads are projected, the third lead bonded to any one of the first and second semiconductor elements via a bonding member.

Still another aspect of the present invention is a semiconductor device including: a plurality of semiconductor elements disposed by stacking; and leads which are electrically bonded to the semiconductor elements, and part of each lead is exposed to the outside. The lead has: an exposure portion which is exposed to the outside; a bonding portion which is electrically bonded to the semiconductor elements, and which is positioned on a plane different from where the exposure portion is positioned; and a continuous portion which makes the bonding portion and the exposure portion continuous. The semiconductor device specifically include: a first island having a first main surface and a second main surface; the first semiconductor element mounted on the first main surface of the first island; the first lead which is continuous from the first island, and which is exposed to the outside; a second island having a first main surface and a second main surface which are different from those of the first island; the second semiconductor element mounted on the first main surface of the second island; and the second lead which is continuous from the second island, and which is exposed to the outside; the third lead which is bonded to an electrode on the first semiconductor element via a bonding member, and which has the bonding portion on the same plane as the first island; and the fourth lead which is bonded to an electrode on the second semiconductor element via a bonding member, and which has the bonding portion on the same plane as the second island. The bonding member which bond the third lead to the first semiconductor element are drawn sideward from a side surface of the first semiconductor element, the side surface being different from another side surface where the first lead is projected. The bonding member which bond the fourth lead to the second semiconductor element are drawn sideward from a side surface of the second semiconductor element, the side surface being different from another side surface where the second lead is projected.

DETAILED DESCRIPTION OF THE PREFERRED EMBODIMENTS

Description will be given of configurations of semiconductor devices according to embodiments of the present invention with reference to FIG. 1 to FIG. 6. FIG. 1 and FIG. 2 are diagrams showing a semiconductor device 10A. FIG. 3 and FIG. 4 are diagrams showing a semiconductor device 10B having a different configuration from that of the semiconductor device 10A. FIG. 5 and FIG. 6 are diagrams showing extracted parts of a lead frame which constitutes the semiconductor device 10B.

Firstly, description will be given of the configuration of the semiconductor device 10A with reference to FIG. 1 and FIG. 2. FIG. 1A is a perspective view of the semiconductor device 10A, and FIG. 1B is a plan view of the semiconductor device 10A as viewed from the below. FIG. 2A is a cross-sectional view taken along the line A-A' in FIG. 1A. FIG. 2B is a cross-sectional view taken along the line B-B' in FIG. 1A.

As shown in FIG. 1A, an outer shape of the semiconductor device 10A is an approximately cubic or an approximately rectangular parallelepiped. The top surface and the bottom surface thereof are flat and parallel to each other. A side surface thereof is inclined, in a way that the upper portion thereof is inclined inward compared to the lower portion. The end portion of a lead, which is electrically bonded to a semiconductor element built in the semiconductor device, is projected to the outside from the lower portion of a side surface of a sealing resin 23 which integrally seals the entire device. Moreover, the bottom surface of the lead exposed to the outside is positioned on the same plane as the bottom surface of the sealing resin 23. The mounting of the semiconductor device 10A is performed through the reflow process in which an unillustrated solder paste adhered to the exposed lead is heated and melted.

As shown in FIG. 1 and FIG. 2, the semiconductor device 10A mainly includes: an island 11; a semiconductor element 13 which is mounted on the bottom surface of the island 11; leads 20B and the like (conductive members), which are continuous with the island 11, and the end portions of which leads are exposed to the outside; leads 20C and 20F which are provided close to the island 11; and the sealing resin 23 which integrally seals these constituents.

Description will be given of a two-dimensional configuration of the semiconductor device 10A with reference to FIG. 1B. The island 11 having an approximately rectangular shape is disposed near the central portion of the semiconductor device 10A. Both leads 20A and 20B are continuous with the side surface of the island 11 on the upper side of FIG. 1B, and projected to the outside. Furthermore, both leads 20E and 20D are also continuous with the side surface of the island 11 on the lower side of FIG. 1B, and projected to the outside. These four leads 20A and the like may be electrically bonded to electrodes (for example, a drain electrode of MOSFET) on the back surface of the semiconductor element 13, or may not be bonded thereto.

Furthermore, both leads 20C and 20F are disposed close to the left side of the island 11. The lower portion of the lead 20C in FIG. 1B is a bonding portion 17, and this portion is bonded to an electrode 19A on the semiconductor element 13 via a thin metal wire 21A. Moreover, the upper portion of the lead 20F is a bonding portion 15, and this portion is bonded to electrodes 19B and 19C on the semiconductor element 13 via thin metal wires 21B and 21C, respectively.

The thin metal wires 21A and the like function as a bonding member which electrically bond the electrodes 19A and the like on the semiconductor element 13 to, for example, the bonding portion 17 of the lead 20C as described above. The thin metal wires 21A and the like are made of a metal material such as gold or aluminium with a diameter of approximately several tens μm. Here, a bonding member other than the thin metal wires can be used. For example, it is possible to employ a bonding plate, which is made by molding a sheet of metal plate into a predetermined shape, as the bonding member. In this case, this embodiment enables the bonding plate to be prevented from coming into contact with the inclining portions of the leads 20C and the like.

For example, when the semiconductor element 13 is a MOSFET, one gate electrode (control electrode: the electrode 19A in this case) provided on the top surface of the semiconductor element 13 is bonded to the bonding portion 17 of the lead 20C via the thin metal wire 21A. Furthermore, the two electrodes 19B and 19C serving as source electrodes (main electrodes) are bonded to the bonding portion 15 of the lead 20F via the two thin metal wires 21B and 21C, respectively. The source electrode of the MOSFET is the main electrode through which a relatively large current passes. Thus, when a larger number of thin metal wires are used for bonding the source electrode than those for the gate electrode serving as the control electrode, the electric resistance of the thin metal wires can be reduced, and thereby the on-resistance is reduced. Note that, the back surface of the semiconductor element 13 is electrically bonded to the top surface of the island 11 as a drain electrode (main electrode), for example. Furthermore, by making the bonding portion 17 of the lead 20C have longer length (larger area) than the bonding portion 15 of the lead 20F, the above bonding can be facilitated.

The sealing resin 23 has a function to cover the semiconductor element and lead frame, and also to support these constituents integrally. As the resin material of the sealing resin 23, a thermosetting resin (for example, an epoxy resin) which is formed by transfer molding, and a thermoplastic resin (for example, an acryl resin) formed by injection molding can be employed. Moreover, in order to, for example, reduce the heat resistance, the resin material filled with a filler such as a metal oxide may be employed as the sealing resin 23. Here, the sealing resin 23 integrally covers the leads, island, semiconductor element and thin metal wires. Furthermore, the end portion of each lead is exposed to the outside from the sealing resin 23, and this portion functions as the external bonding terminal.

Next, description will be given of cross-sectional configurations of the semiconductor device 10A with reference to the cross-sectional views in FIG. 2A and FIG. 2B.

As shown in FIG. 2A, the island 11 and the bonding portion 15 are positioned on the same plane within and on the upper side of the sealing resin 23. The semiconductor element 13 is fixed to the bottom surface of the island 11 with a fixing agent such as solder interposed therebetween. Moreover, the electrode on the bottom surface of the semiconductor element 13 is bonded to the bottom surface of the bonding portion 15 via the thin metal wire 21B.

As shown in FIG. 2B, the lead 20C consists of: an inclined portion 25C (continuous portion), which is continuous with an island 11, and which inclines downward and concurrently outward; and an exposure portion 27C, which is exposed to the outside from the sealing resin 23, and whose bottom surface is positioned on the same plane as the bottom surface of the sealing resin 23. This configuration is similarly employed to the other leads. In this embodiment, the inclined portion 25C is formed as projecting in a direction in which the semiconductor element 13 is fixed (downward direction in this case) to the conductive members (the island 11 and the bonding portion 15). Herein, the inclined portion 25C may be formed in a straight shape or curved shape. The inclined portion 25C can be molded in a predetermined shape by a punching process with a die.

In this embodiment, as shown in FIG. 1B, the electrodes 19A and the like on the semiconductor element 13 are bonded to the leads 20C and the like which are disposed adjacent to the side surface of the island 11, the side surface being not provided with the leads 20B and the like which are continuous with the island 11. Specifically, the leads which are continuous with the island 11, and which are integrally projected to the outside, are the leads 20A, 20B, 20E and 20D. Moreover, the leads which are bonded to, for example, the electrode 19A on the semiconductor element 13 via the thin metal wire 21A, are the leads 20C and 20F. The bonding portions of the leads 20C and 20F are bonded to the electrodes on the semiconductor element 13 via the thin metal wires 21A, 21B and 21C. These thin metal wires 21A and the like pass above the side surface on the left side of the semiconductor element 13.

In other words, the leads 20A, 20B, 20E and 20D which are continuous with the island 11 are provided around the side surfaces on the upper and lower sides of the semiconductor element 13. Meanwhile, the leads 20C and 20F which are bonded to the electrodes via the thin metal wires 21A and the like are provided to the side surface on the left side of the semiconductor element 13.

The above configuration enables the semiconductor 10A to be reduced in the two-dimensional manner, and a capillary is prevented from coming into contact with the leads at the time of the wire-bonding. Specifically, the semiconductor element can be bonded to the leads by use of the thin metal wires, if the leads serving as the bonding areas have flat portions. For example, the flat portion (area A1 shown in FIG. 1B) of the lead 20A around the portion continuous with the island 11 can be bonded to one end of the thin metal wire, the other end of which wire is bonded to the semiconductor element. However, an inclined portion 25A of the lead 20A is provided around the area A1. Accordingly, when the capillary used for the wire-bonding approaches the area A1, the capillary comes into contact with the inclined portion 25A, resulting in the deformation and breakage of the lead 20A. In addition, if the area A1 is expanded to make the wire-bonding possible, the length in a vertical direction of the semiconductor device in FIG. 1B is increased, resulting in a problem of an increased two-dimensional area of the semiconductor device 10A.

In this embodiment, in order to prevent the breakage of the leads, the leads 20C and 20F are provided close to the side surface of the semiconductor element 13 different from other side surfaces adjacent to the leads 20A and the like integrated with the island 11. Moreover, the thin metal wires are bonded to these leads 20C and 20F for the electric conduction to the semiconductor element 13. Specifically, the bonding portion 17 of the lead 20C is bonded to the electrode 19A on the semiconductor element 13 via the thin metal wire 21A. Furthermore, the bonding portion 15 of the lead 20F is bonded to the electrodes 19B and 19C on the semiconductor element 13 via the two thin metal wires 21B and 21C, respectively.

The bonding portion 17 of the lead 20C is disposed apart from the inclined portion 25C. Thus, even when the capillary for performing the wire-bonding approaches the top surface of the bonding portion 17, the capillary does not come into contact with the inclined portion 25C. Accordingly, the deformation and breakage of the lead 20C are prevented at the time of the wire-bonding.

The above-mentioned matter is also applied to the bonding portion 15 of the lead 20F. Specifically, even when the capillary to form the thin metal wires 21B and 21C approaches the bottom surface of the bonding portion 15, the capillary does not come into contact with the inclined portion 25F. As a result, the breakage of the lead 20F is prevented at the time of the wire-bonding.

As shown in FIG. 1A and FIG. 1B, the leads 20C and 20F are provided on the left side of the island 11 (semiconductor element 13). However, the positional relationship between the leads and the island may be established in other ways. Specifically, one lead integrated with the island 11 may be provided close to one side surface of the semiconductor element, while other lead to be bonded to an electrode on the semiconductor element 13 may be provided close to another side surface or the other three side surfaces. Alternatively, one lead to be bonded to an electrode on the semiconductor element 13 may be provided close to one side surface of the semiconductor element 13, while other lead integrated with the island 11 may be provided close to another side surface or the other three side surfaces.

Next, description will be given of configurations of a semiconductor device 10B according to another embodiment with reference to FIG. 3 to FIG. 6. FIG. 3 and FIG. 4 are diagrams showing the configurations of the semiconductor device 10B. FIG. 5 and FIG. 6 are diagrams showing extracted parts of leads and semiconductor elements which constitute the semiconductor device 10B.

The basic configuration of the semiconductor device 10B shown in these diagrams is the same as that of the semiconductor device 10A, and accordingly the description of the similar constituents will be omitted. The difference between the semiconductor device 10B to be described hereinafter and the above-described semiconductor device 10A is that two semiconductor elements are stacked in the semiconductor device 10B.

Description will be given of the configuration of the semiconductor device 10B with reference to FIG. 3A, FIG. 3B and FIG. 3C. FIG. 3A is a perspective view showing the semiconductor device 10B. FIG. 3B is a plan view of the semiconductor device 10B as viewed from the above. FIG. 3C is a plan view of the semiconductor device 10B as viewed from the below.

As shown in FIG. 3A, the semiconductor device 10B is a resin-sealed package in which a plurality of semiconductor elements are sealed with a resin. In the semiconductor device 10B, firstly, a first semiconductor element 12 and a second semiconductor element 14 are built in, so that the first semiconductor element 12 is superposed on the second semiconductor element 14. As shown in FIG. 3A to FIG. 3C, the first semiconductor element 12 is fixed to the top surface of a first island 16, and the second semiconductor element 14 is fixed to the bottom surface of a second island 18. Accordingly, the first semiconductor element 12 and the second semiconductor element 14 are disposed in opposite directions with respect to the thickness direction of the semiconductor device 10B. Specifically, the surface of the first semiconductor element 12 on which electrodes are to be formed faces upward, and the surface of the second semiconductor element 14 on which electrodes are to be formed faces downward.

With reference to FIG. 3B and FIG. 3C, description will be given of a two-dimensional configuration of the semiconductor device 10B. In these diagrams, the dotted line indicates the periphery of a sealing resin 38, and the dashed line indicates the periphery of the first semiconductor element 12. Furthermore, in these diagrams, a lead and a land (first lead frame), indicated by the dense hatching, contribute to the mounting and connecting of the first semiconductor element 12. Meanwhile, a lead and a land (second lead frame), indicated by the rough hatching, contribute to the mounting and connecting of the second semiconductor element 14. A bonding portion 24 and the first island 16 of the first lead frame are positioned on a plane different from that for a bonding portion 28 and the second island 18 of the second lead frame. With reference FIG. 4A, the bonding portion 24 and the first island 16 of the first lead frame are positioned above the bonding portion 28 and the second island 18 of the second lead frame.

FIG. 3B is a plan view of the semiconductor device 10B shown in FIG. 3A as viewed from the above. As shown in FIG. 3B, the first semiconductor element 12 fixed to the top surface of the first island 16 is bonded to the top surface of leads 20D and the like via thin metal wires 30A and the like. Herein, the first semiconductor element 12 is electrically bonded to each lead via the three thin metal wires 30. Specifically, an electrode 32 on the first semiconductor element 12 is bonded to the top surface of a bonding portion 22 of the lead 20D via the thin metal wire 30A. Furthermore, the two electrodes 32 on the first semiconductor element 12 are bonded to the top surface of the bonding portion 24 of a lead 20H via two thin metal wires 30B and 30C.

FIG. 3C is a plan view of the semiconductor device 10B shown in FIG. 3A as viewed from the below. As shown in FIG. 3C, the second semiconductor element 14 is mounted on the bottom surface of the second island 18. As in the case of the above-described first semiconductor element 12, electrodes 36 provided on the bottom surface of the second semiconductor element 14 are bonded to corresponding bonding portions of the leads via thin metal wires. The second semiconductor element 14 is, for example, a MOSFET. Specifically, the electrode 36 (gate electrode) provided on the bottom surface of the second semiconductor element 14 is bonded to a bonding portion 26 of a lead 20A via a thin metal wire 31A. Moreover, the other two electrodes 36 (source electrodes) on the second semiconductor element are bonded to the bottom surface of the bonding portion 28 of a lead 20E via two thin metal wires 31B and 31C. Furthermore, a drain electrode provided on the top surface of the second semiconductor element 14 is mounted on the bottom surface of the second island 18.

Both semiconductor elements with the above-described configurations are disposed, so that one of the semiconductor elements is superposed on the other semiconductor element as extending to the island on which the other semiconductor element is mounted. Specifically, as shown in FIG. 3B, the first semiconductor element 12 fixed to the top surface of the first island 16 is disposed so that the first semiconductor element 12 is superposed as extending to the top of the second island 18.

As shown in FIG. 3B and FIG. 3C, each of the first island 16 and the second island 18 is disposed as superposing in a direction parallel to the side surface of the semiconductor element to be mounted thereon. Here, the two-dimensional shape of the first semiconductor element 12 and the second semiconductor element 14 is a rectangle having the side surfaces in the longitudinal direction in the horizontal direction of the diagrams. Moreover, the first island 16 and the second island 18 are superposed in the longitudinal direction. With such a configuration, the semiconductor elements are more stably supported by the islands which have smaller areas than the semiconductor elements to be mounted thereon. Furthermore, the electrodes on the semiconductor elements to be mounted are disposed within areas of the islands for supporting the semiconductor elements, and thereby the wire-bonding is performed stably.

It is also a case in the semiconductor device 10B that one side surface of the semiconductor element, which is close to the leads integrated with the island, differs from another side surface of the semiconductor element, which is close to the leads bonded to the thin metal. Specifically, as shown in 3C, leads 20G and 20F integrated with the second island 18 are close to the side surface on the lower side of the semiconductor element 14. Meanwhile, the leads 20A and 20E bonded to the thin metal leads 31A and the like are close to the side surface on the right side of the second semiconductor element 14. With this configuration, even if the thin metal wire 31A is bonded to the bonding portion 26 of the lead 20A, the capillary used for the bonding does not come into contact with an inclined portion 40A of the lead 20A. Thus, the deformation of the lead 20A at the time of the wire-bonding is prevented. Similarly, even if thin metal wires 31B and 31C are bonded to the bonding portion 28 of the lead 20E, the capillary does not come into contact with an inclined portion 40E.

On the other hand, as to the lead 20D and the like bonded to the first semiconductor element 12 shown in FIG. 3B, the lead 20D is curved in the depth direction of FIG. 3B. For this reason, when the thin metal wire 30A is formed, there is no problem that the capillary comes into contact with the inclined portion of the lead.

As shown in FIG. 3B, first island 16 and the second island 18 have identical shapes and are arranged rotational symmetrically to each other.

Next, description will be given of cross-sectional configurations of the semiconductor device 10B with reference to FIG. 4A and FIG. 4B. FIG. 4A is a cross-section view taken along the line A-A' in FIG. 3A. FIG. 4B is a cross-sectional view taken along the line B-B' in FIG. 3A.

As shown in FIG. 4A, the first semiconductor element 12 is fixed to the top surface of the first island 16. The electrode on the top surface of the first semiconductor element 12 is bonded to the bonding portion 24 of the lead via the thin metal wire 30B. Moreover, the second semiconductor element 14 is fixed to the bottom surface of the second island 18. The electrode on the second semiconductor element 14 is bonded to the bottom surface of the bonding portion 28 of the lead via the thin metal wire 31B.

In this respect, the first island 16 and the second island 18 are disposed so as to be shifted from each other in a thickness direction while overlapping with each other in the thickness direction. Herein, the first island 16 is disposed slightly upward within the sealing resin 38. Meanwhile, the second island 18 is disposed downward compared to the first island 16. Here, these islands may be partially superposed on each other, or may not be superposed at all.

Herein, the thickness of each of the first island 16 and the second island 18 is approximately 0.5 mm as an example. Additionally, a thickness L1 of these superposed islands is smaller than that of each island, and approximately 0.2 mm. Moreover, a length L2 which is a distance between the bottom surface of the first island 16 and the top surface of the second semiconductor element 14 is approximately 0.3 mm. Furthermore, a length L3 which is a distance between the bottom surface of the first semiconductor element 12 and the top surface of the second island 18 is approximately 0.3 mm.

By partially superposing the first island 16 and the second island 18 in the thickness direction, the thickness of the semiconductor device 10B is made small, and also the insulation between the islands and the semiconductor elements is maintained. For example, in comparison with the case where two semiconductor elements are mounted on both top and bottom main surfaces of two superposed islands, the semiconductor device 10B is made small by the length (L1) the two islands superposed in the thickness direction.

Furthermore, the first semiconductor element 12 is disposed on the top surface of the first island 16, and the back surface and the side surfaces thereof is covered by the sealing resin 38 which seals the entire semiconductor device. In addition, the second semiconductor element 14 is fixed to the bottom surface of the second island 18, and the top surface and the side surfaces thereof is covered by the sealing resin 38. Moreover, the first island 16 and the second island 18 are shifted. Thereby, the first island 16 is set apart from the second semiconductor element 14, and the second island 18 is set apart from the first semiconductor element 12. Accordingly, even when relatively large semiconductor elements are stacked and built in the small-sized semiconductor device 10B, it is possible to prevent the short-circuit between the semiconductor elements and islands.

Still furthermore, in this embodiment, the sealing resin 38 is filled in the space between the bottom surface of the first island 16 and the top surface of the second semiconductor element 14, and the space between the top surface of the second island 18 and the bottom surface of the first semiconductor element 12. Here, if it is difficult to fill the sealing resin 38 containing a filler in the spaces, a resin material with an excellent flowability (for example, a resin mixed with a relatively small amount of filler) may be filled in the spaces prior to the resin-sealing step. Additionally, an adhesive agent made of, for example, an epoxy resin may be filled in the spaces.

In addition, if the semiconductor elements are to pass the current on the back surfaces thereof, the semiconductor elements are fixed to the main surfaces of the islands on which the semiconductor elements are mounted, by means of a conductive adhesive agent or the eutectic bonding. Moreover, if the back surfaces of these semiconductor elements are not intended for the electric conduction, the semiconductor elements may be mounted on the islands by means of an insulating adhesive agent.

FIG. 5 and FIG. 6 are perspective views showing extracted parts of the semiconductor device 10B shown in FIG. 3.

With reference to FIGS. 5A and 5B, description will be given of a configuration of the first island 16 and the like which the first semiconductor element 12 is mounted on or connected to. FIG. 5A is a perspective view of the first semiconductor element 12, the first island 16 and the like, as viewed from the above. FIG. 5B is the perspective view as viewed from the below.

FIG. 5A and FIG. 5B show the first island 16 on which the first semiconductor element 12 is mounted, as well as two leads 20B and 20C which are projected to the outside from the first island 16. Moreover, the leads 20H and 20D are shown on the front side of FIG. 5A and FIG. 5B. The bonding portion 22 of the lead 20H is bonded to the first semiconductor element 12 via the thin metal wire 30A. The bonding portion 24 of the lead 20D is bonded to the first semiconductor element 12 via the thin metal wires 30B and 30C.

The first island 16 and the leads 20H and 20D shown in these diagrams are integrally combined and supplied as a single lead frame in the manufacturing steps.

With reference to FIG. 6A and FIG. 6B, description will be given of a configuration of the second island 18 on which the second semiconductor element 14 is mounted, as well as the leads 20G and the like. The viewpoints of FIG. 6A and FIG. 6B are the same as those of FIG. 5A and FIG. 5B.

As shown in FIG. 6A and FIG. 6B, the leads 20G and 20F are projected to the outside from the second island 18 on which the second semiconductor element 14 is mounted. Moreover, the bottom surface of the bonding portion 26 of the lead 20E is bonded to the electrode provided on the bottom surface of the second semiconductor element 14 via an unillustrated thin metal wire 31A. The bonding portion 28 of the lead 20A is bonded to the electrodes on the second semiconductor element 14 via the thin metal wires 30C and 30B.

The second island 18 and the leads 20E and 20A shown in these diagrams are integrally combined and supplied as a single lead frame in the manufacturing steps. Here, in the manufacturing steps, the lead frame including the second island 18 and the like shown in FIG. 6A and FIG. 6B is prepared separately from the lead frame including the first island 16 shown in FIG. 5A and FIG. 5B.

Next, description will be given of a method of manufacturing the semiconductor device 10B with the above-described configuration with reference to FIG. 7 to FIG. 10. In this embodiment, the semiconductor device is manufactured by performing die bonding and wire-bonding on each of two lead frames (a lead frame 50 shown in FIG. 7 and a lead frame 60 in FIG. 8), by stacking the lead frames, and thereafter by sealing them with resin.

Description will be given of a configuration of the lead frame 50 with reference to FIGS. 7A and 7B. FIG. 7A is a plan view showing a part of the lead frame 50, and FIG. 7B is an enlarged perspective view showing a unit 52

As shown in FIG. 7A, the lead frame 50 is made of a metal such as copper, and molded into a predetermined shape by processing (etching or punching process) a single conductive foil having a thickness of approximately 0.5 mm. Here, the lead frame 50 has a schematically strip shape. An enclosure 54 having a picture-frame-like shape is provided on four side surfaces of the lead frame 50. An attachment portion 58 is extended in a lattice shape on the inner side of the enclosure 54.

Furthermore, guide holes 56 are provided, penetrating through the enclosure 54 in a thickness direction. The guide holes 56 are used for a transfer and a positioning in each of manufacturing steps. By superposing the guide holes 56, which are provided in the lead frame 50 shown in FIG. 7A, on guide holes 66 in the lead frame 60 shown in FIG. 8A, the units included in each lead frame are accurately positioned.

As shown in FIG. 7B, the unit 52 is provided on the inner side of the attachment portion 58. The unit 52 is a unit for constituting one semiconductor device. Here, the single unit 52 corresponds to the portion indicated by the dense hatching in FIG. 3B. Specifically, three leads (leads 20D, 20C and 20B) are extending inward from the attachment portion 58 on the back side of FIG. 7B. The leads 20C and 20B are continuous with an island 16. Additionally, a bonding portion 22 is provided on the tip portion of the lead 20D. Moreover, a lead 20H having a bonding portion 24 on the tip portion thereof is extended inward from the attachment portion 58 on the front side of FIG. 7B. Furthermore, each lead includes an inclined portion 40 and an exposure portion 42 as shown in FIG. 7B. Still furthermore, the tip portion (the bonding portions 22, 24) of each lead and the first island 16 within the unit 52 are positioned on the same plane, but positioned above the other components (such as the enclosure 54 and the attachment portion 58) of the lead frame 50.

Here, one semiconductor device is constituted by superposing the lead frame 50 on the lead frame 60 (see FIG. 8) in this embodiment as described above. In this respect, as seen in the manufactured semiconductor device 10B (see FIG. 3), the bottom surface of the exposure portion of one lead is positioned on the same plane as those of the other leads. Accordingly, a pressing process may be performed at the joint spot between each lead and the attachment portion 58 of the lead frame 50 so that each lead can be projected upward (in the thickness direction). Thereby, the end portions of the leads in the lead frame 50 are positioned on the same plane as end portions of leads in the lead frame 60. The above-mentioned matter may be similarly applied to a configuration of the lead frame 60 to be described in detail hereinafter.

Description will be given of the configuration of the lead frame 60 with reference to FIG. 8A and FIG. 8B. FIG. 8A is a plan view of the lead frame 60. FIG. 8B is a perspective view showing the unit 62. Here, the lead frame 60 is the portion indicated by the rough hatching in FIG. 3B. Furthermore, the difference between the lead frame 50 shown in FIG. 7 and the lead frame 60 shown in FIG. 8 is only the internal configuration of the unit 62, and other configurations are basically the same.

As shown in FIG. 8A, the lead frame 60 is formed by providing an attachment portion 68 in a lattice shape on the inner side of an enclosure 64. Two units 62 are disposed in each opening surrounded by the attachment portion 68. The guide hole 66 is also provided here, penetrating through the enclosure 64 of the lead frame 60 in a thickness direction.

As shown in FIG. 8B, the single lead 20A is extended inward from the attachment portion 68 on the back side of the FIG. 8B. The tip portion of the lead 20A is a flat bonding portion 26. Moreover, three leads 20G, 20F and 20E are extending inward from the attachment portion 68 on the front side of FIG. 8B. The tip portions of the two leads 20G and 20F are continuous with a second island 18. Furthermore, the tip portion of the lead 20E is a bonding portion 28.

As shown in FIG. 7B and FIG. 8B, the units 52 and 62 have the differences in the island shape and the projecting direction of the leads in the thickness direction. Furthermore, in the unit 52 shown in FIG. 7B, the leads are projected in a direction in which the semiconductor device is mounted (upward direction in FIG. 7B). Meanwhile, in the unit 62 shown in FIG. 8B, the leads are projected in an opposite direction in which the semiconductor device is mounted (upward direction in FIG. 8B). Additionally, the first island 16 and the second island 18 are point symmetry, so that these islands have the same shapes when rotated at 180° around a certain point as the center of rotation.

Next, description will be given of die bonding and wire-bonding steps. FIG. 9 is a perspective view showing the unit 52 of the lead frame 50 after both steps are completed. FIG. 10A is a perspective view showing the unit 62 of the lead frame 60 in the same state as that in FIG. 9. FIG. 10B is a cross-sectional view showing the wire-bonding step.

As shown in FIG. 9, a first semiconductor element 12 is mounted on the top surface of the first island 16 of the lead frame 50. An electrode formed on the top surface of the first semiconductor element 12 is bonded to the bonding portion 22 or 24 via a thin metal wire. This step is performed simultaneously on all the units 52 in the lead frame 50. In this step, the inclined portions in the leads 20D and the like of the lead frame 60 is projected upward with respect to the thickness direction. Accordingly, a capillary used for the wire-bonding does not come into contact with the inclined portions in the leads.

As shown in FIG. 10A, a second semiconductor element 14 is mounted on the bottom surface of the second island 18 of the lead frame 60. Furthermore, each electrode provided on the bottom surface of the second semiconductor element 14 is bonded to the bottom surface of the bonding portion 26 or 28 via an unillustrated thin metal wire. In practice, this step is performed while the lead frame 60 is inverted in the vertical direction (that is, the top surface of the lead frame 60 is the surface on which the first semiconductor element 14 is mounted).

As shown in FIG. 10B, a thin metal wire 21B is formed by using a capillary 29 in the wire-bonding step. Specifically, firstly, the thin metal wire 21B is bonded to an electrode on the top surface of a semiconductor element 13. Then, the capillary 29 is moved to the top surface of the bonding portion 28, and subsequently the thin metal wire 21B is bonded to the top surface of the bonding portion 28. At this time, a bonding energy (pressure force, ultrasonic vibration, thermal energy) is provided to the contact portion where the thin metal wire 21B comes into contact with the bonding portion 28. Thereafter, the capillary 29 is moved upward, and the thin metal wire 21B is cut off.

As shown in FIG. 10A, the bonding portion 28 of a lead 20E is disposed apart from an inclined portion 40E in the lead 20E as described above. Furthermore, the unillustrated capillary is moved in the horizontal direction of FIG. 10A, and a lead 20A including the bonding portion 26 extends in the vertical direction of FIG. 10A. In other words, the direction of the capillary movement is not parallel but perpendicular to the extending direction of the lead 20A. Thereby, even when the wire-bonding is performed as described above, the capillary 29 does not come into contact with the inclined portion 40E. As a result, the breakage of the lead 20E is prevented.

After the above steps are completed, the lead frames 50 and 60 are superposed and combined. As a result, each unit of the combined lead frames has the configuration as shown in FIG. 3. Moreover, the unit of the lead frame is subjected to a resin-sealing step after individually accommodated in a molding-die. Specifically, in the resin-sealing step, the semiconductor elements, islands, thin metal wires and leads of each unit are sealed with a sealing resin. Furthermore, the semiconductor device 10B with the configuration shown in FIG. 3 is completed through the steps of: plating the surface of the lead exposing from the sealed resin; individually separating each unit, which is sealed with resin, from the lead frames; measuring the condition or electrical characteristic of each unit; printing; and the like.

Furthermore, in a case where the semiconductor device 10A with the configuration shown in FIG. 1 is manufactured, only one lead frame 60 is prepared, and the above-described steps are performed.

According to the present invention, provided is a semiconductor device in which the leads are not deformed at the time of bonding. Specifically, as shown in FIG. 1B, the bonding portions 17 and 15 to which the thin metal wires 21A and the like are bonded, are not close to the inclined portions of the leads. Thereby, even if the wire-bonding is performed on the main surfaces of the bonding portions 17 and 15, the spots to which the thin metal wires 21A and the like are bonded, are isolated from the inclined portions of the leads. Accordingly, at the time of wire-bonding, the capillary does not come into contact with the lead, and thus the deformation and breakage of the leads are prevented.

Figure 1A:
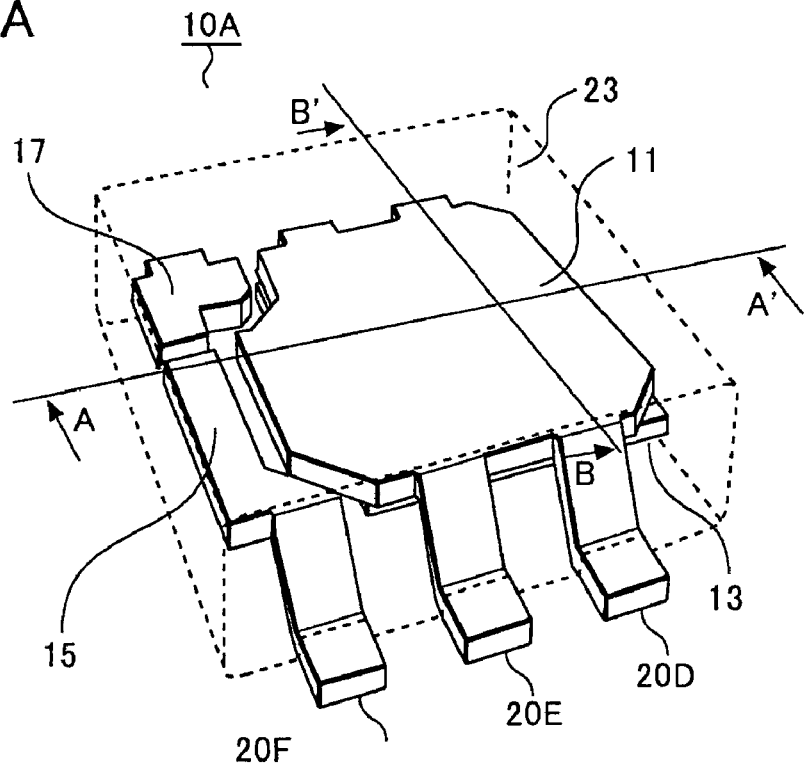
FIG. 1A is a perspective view.
Figure 1B:
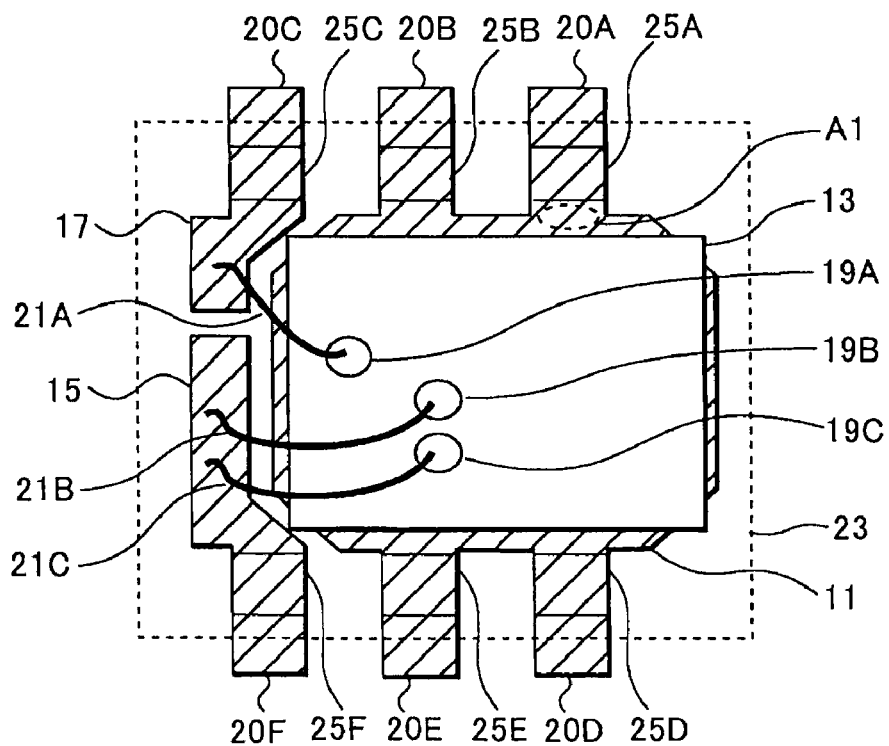
FIG. 1B is a plan view, showing a semiconductor device according to the present invention.
Figure 2A:
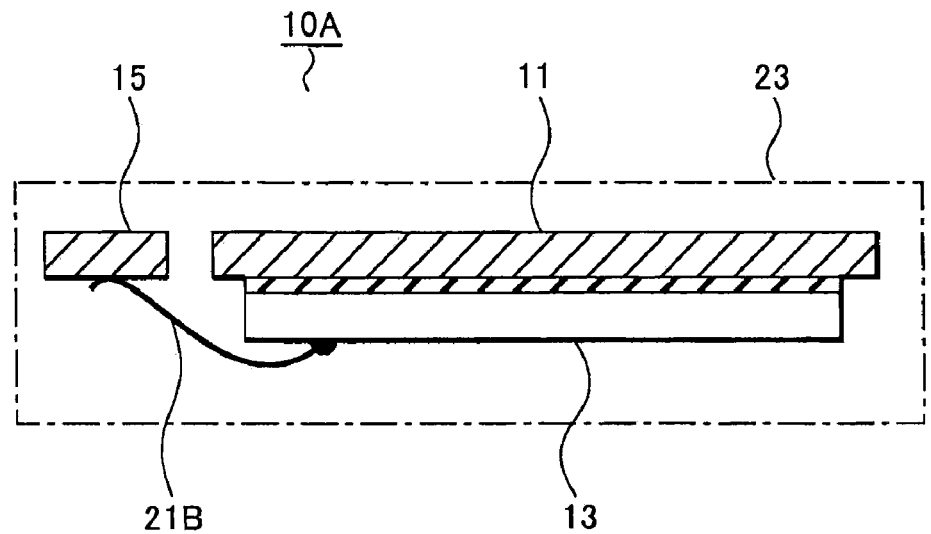
FIG. 2A and FIG. 2B are cross-sectional views showing the semiconductor device according to the present invention.
Figure 2B:
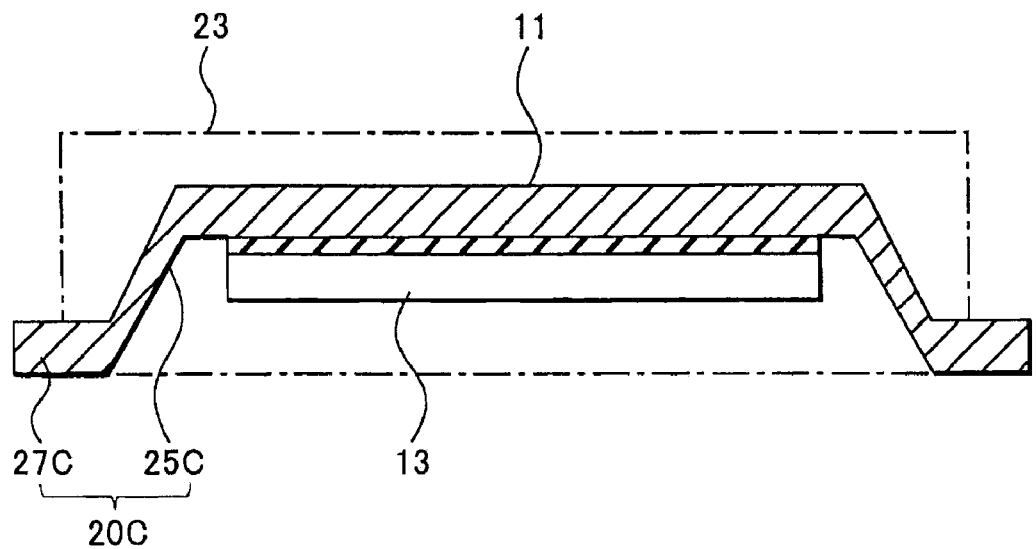
Figure 3A:
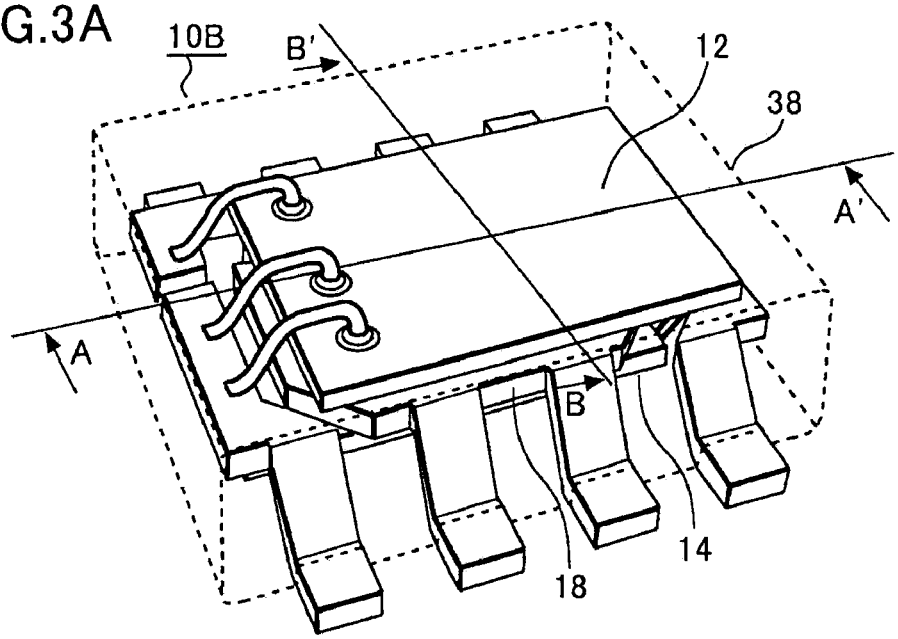
FIG. 3A is a perspective view.
Figure 3B:
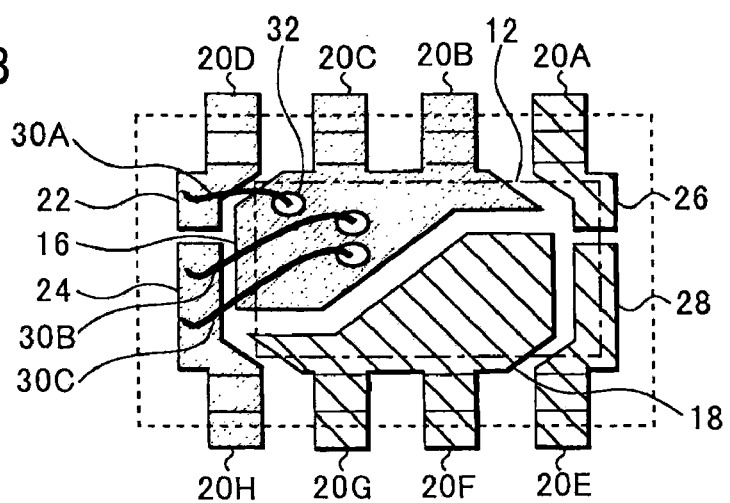
FIG. 3B and FIG. 3C are plan views, showing another semiconductor device according to the present invention.
Figure 3C:
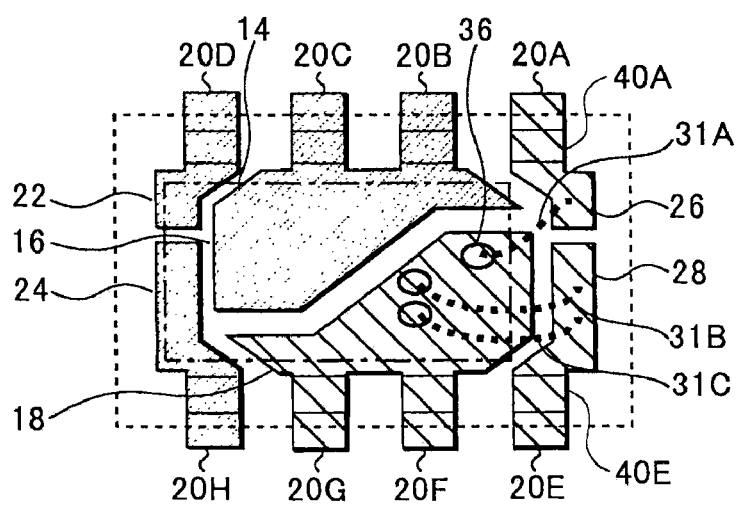
Figure 4A:
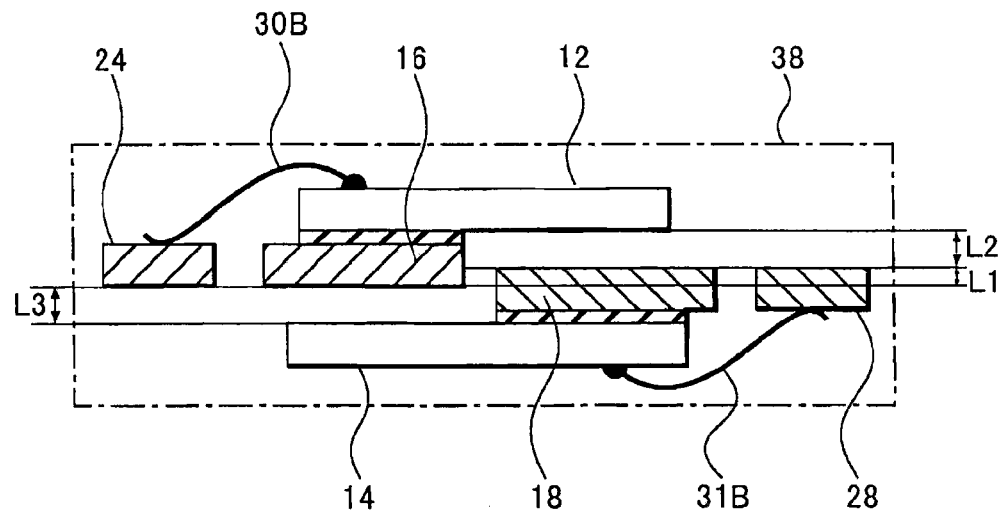
FIG. 4A and FIG. 4B are cross-sectional views showing the semiconductor device according to the present invention.
Figure 4B:
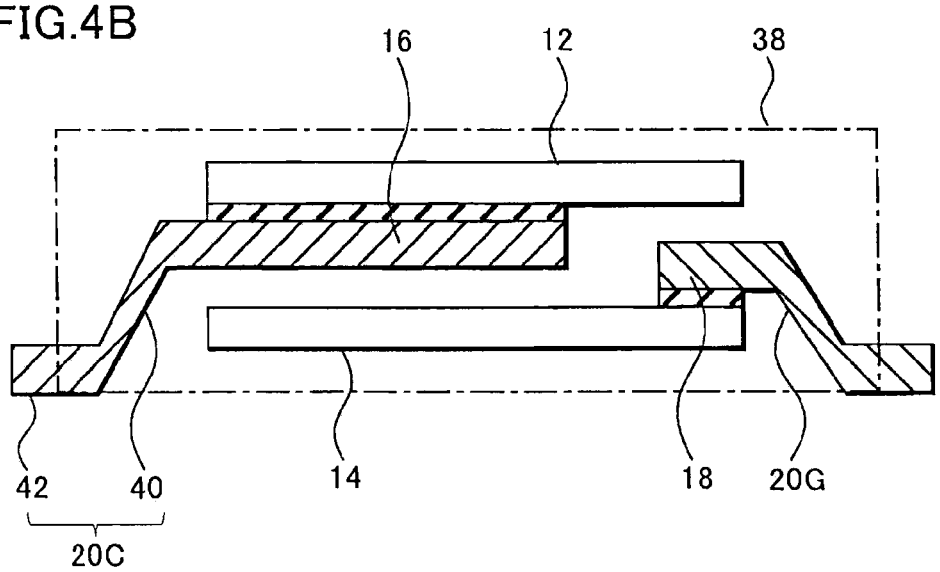
Figure 5A:
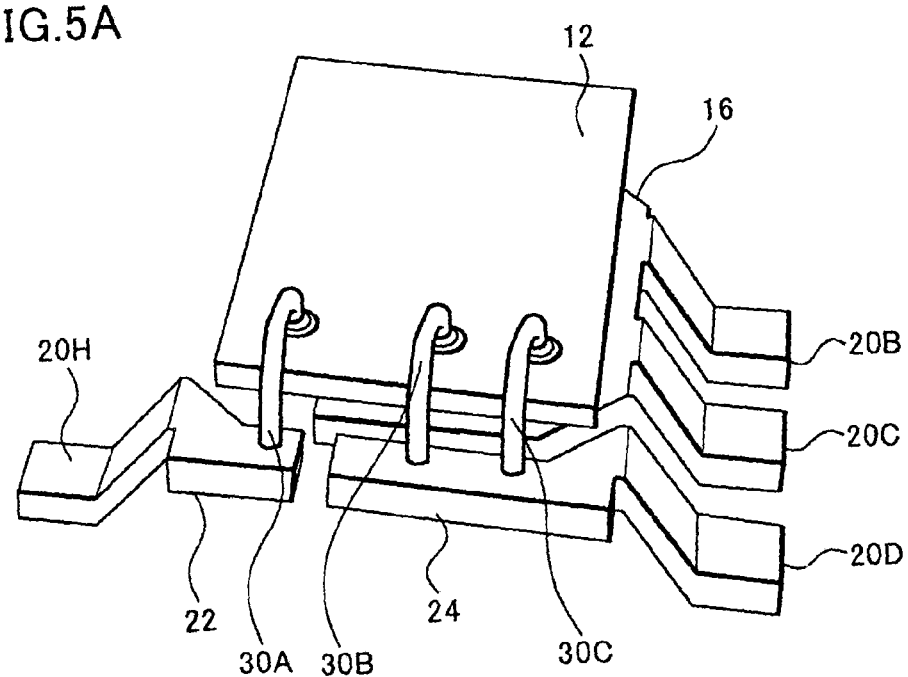
FIG. 5A and FIG. 5B are perspective views showing an extracted part of the semiconductor device according to the present invention.
Figure 5B:
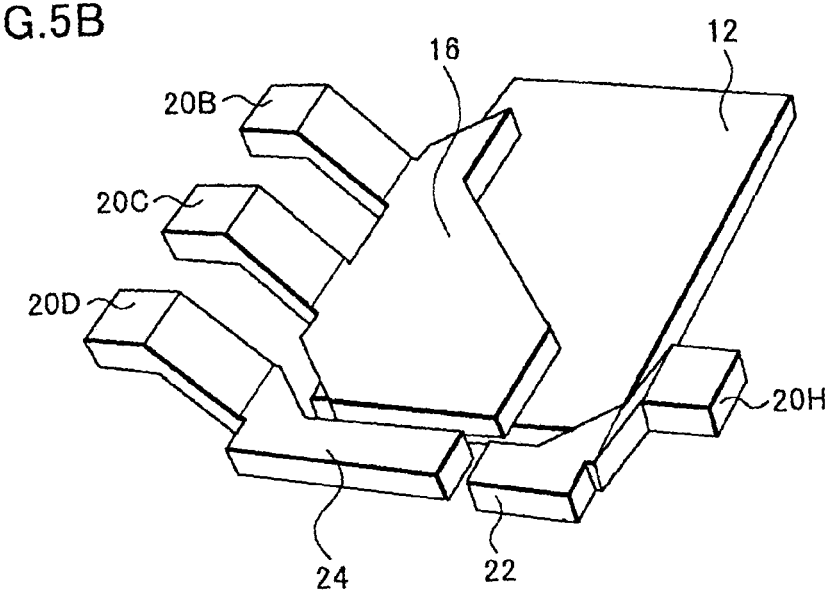
Figure 6A:
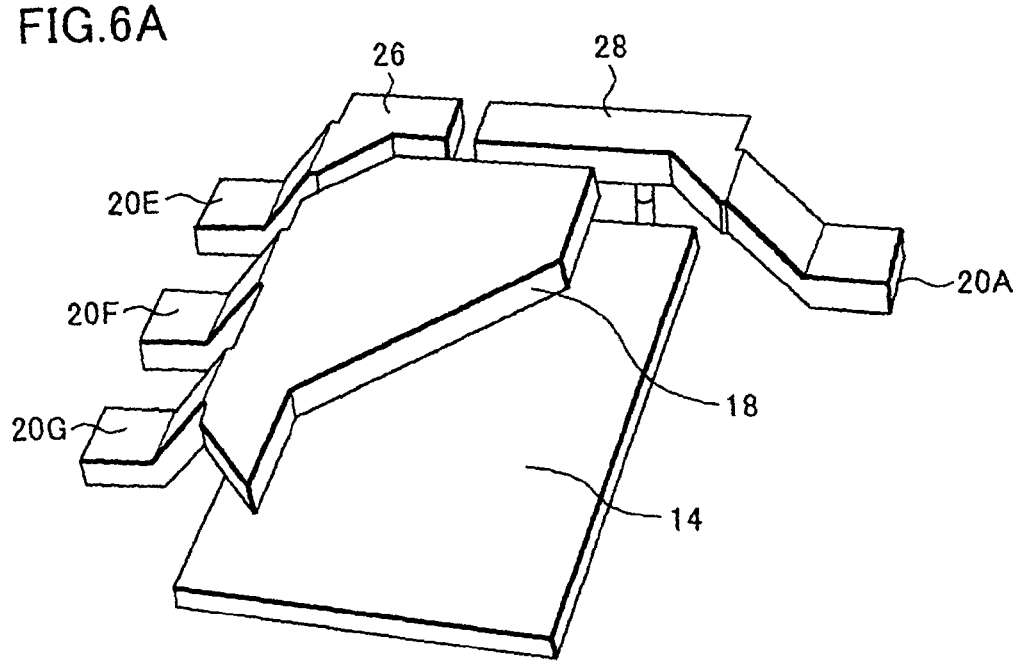
FIG. 6A and FIG. 6B are perspective views showing another extracted part of the semiconductor device according to the present invention.
Figure 6B:
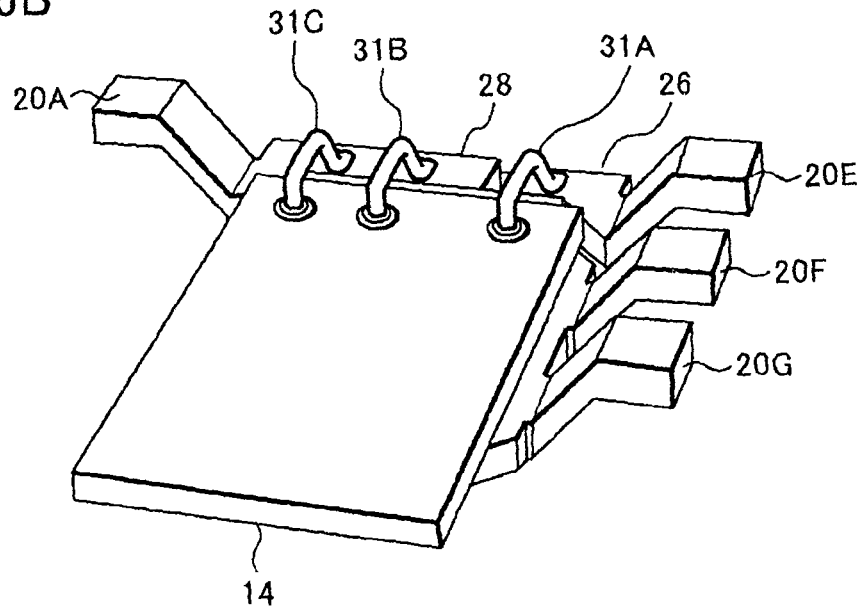
Figure 7A:
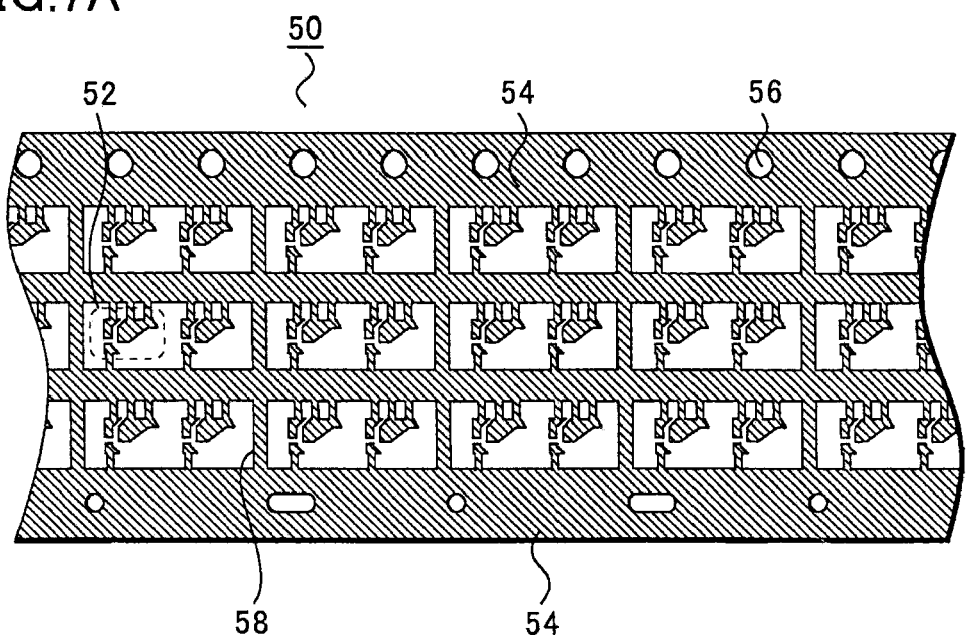
FIG. 7A is a plan view.
Figure 7B:
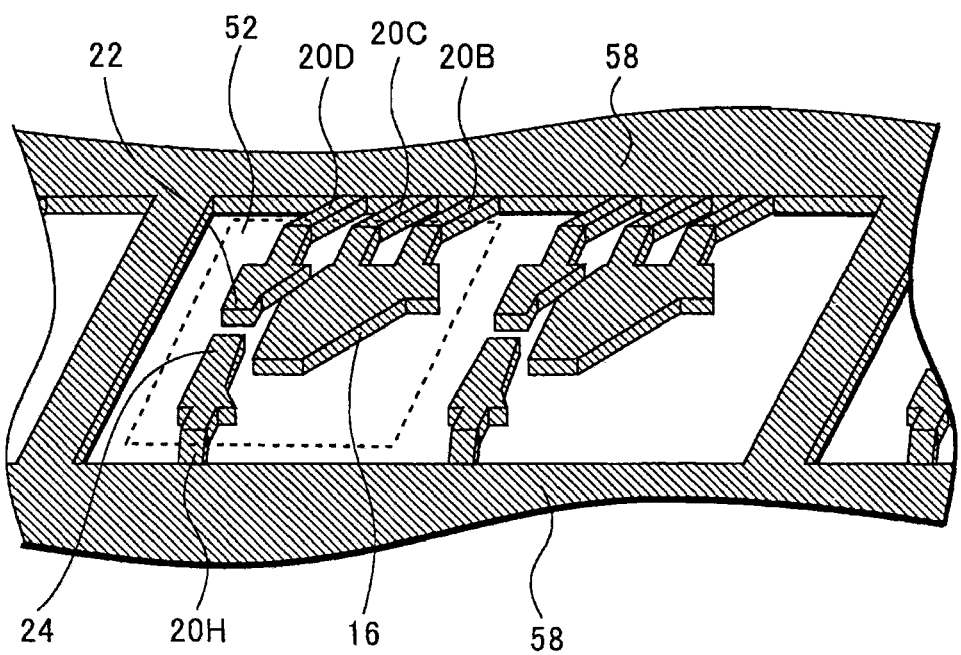
FIG. 7B is a perspective view, for describing a method of manufacturing a semiconductor device according to the present invention.
Figure 8A:
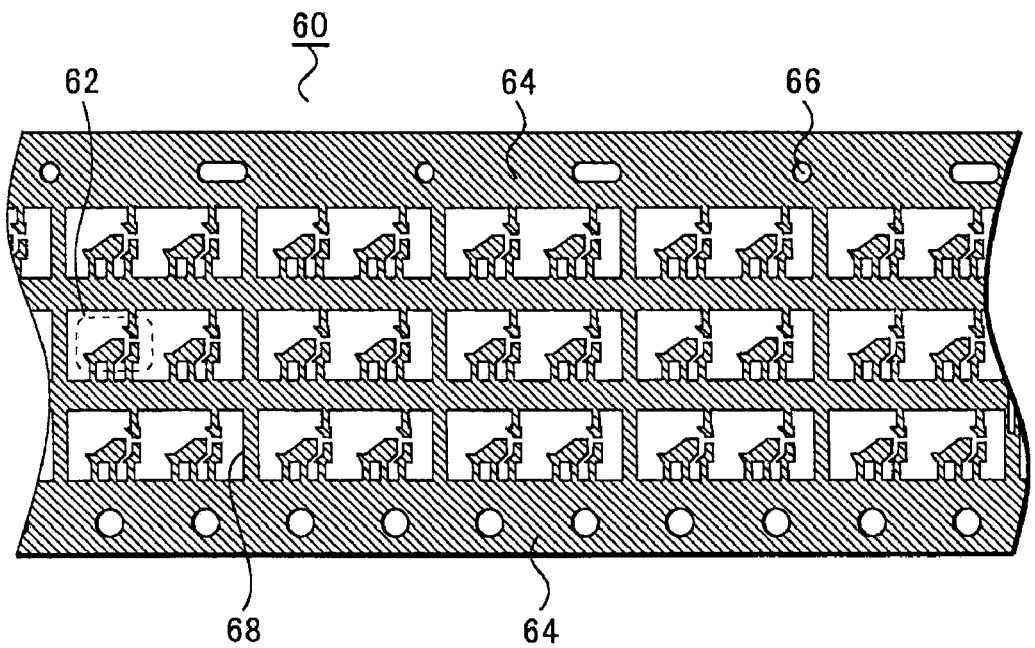
FIG. 8A is a plan view.
Figure 8B:
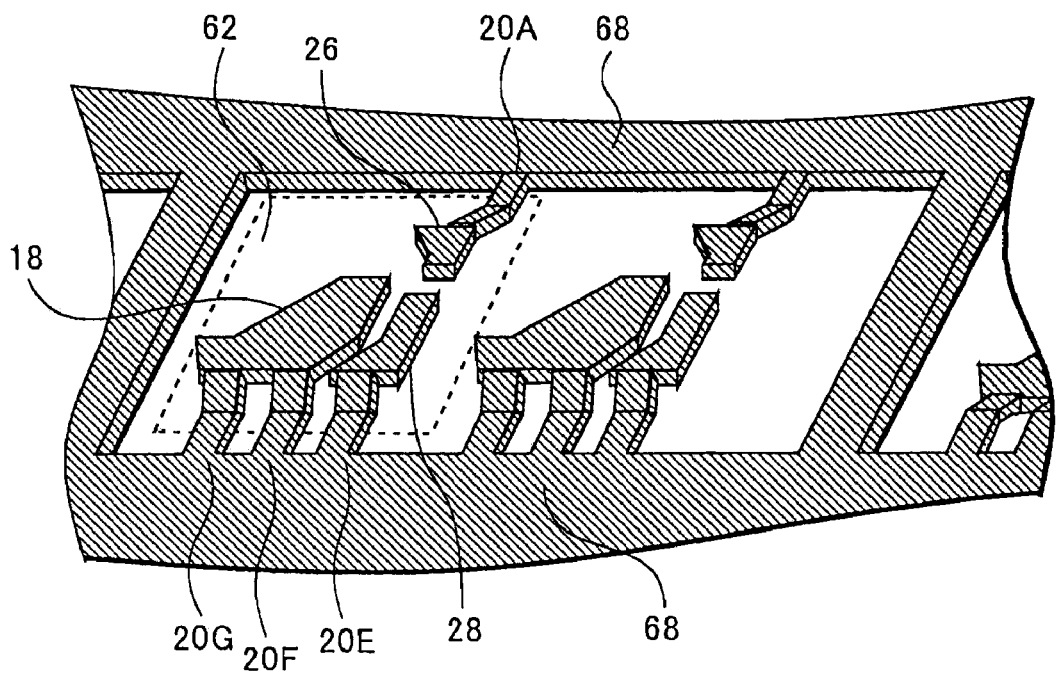
FIG. 8B is a perspective view, for describing the method of manufacturing a semiconductor device according to the present invention.
Figure 9:
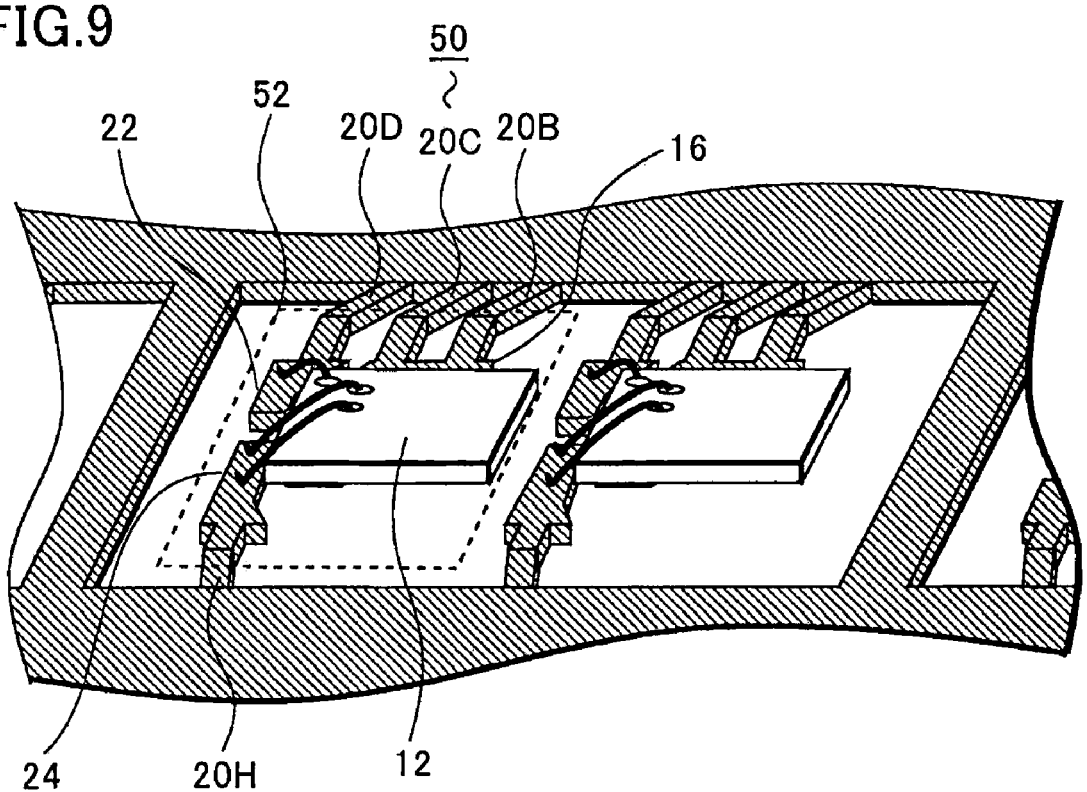
FIG. 9 is a perspective view for describing the method of manufacturing a semiconductor device according to the present invention.
Figure 10A:
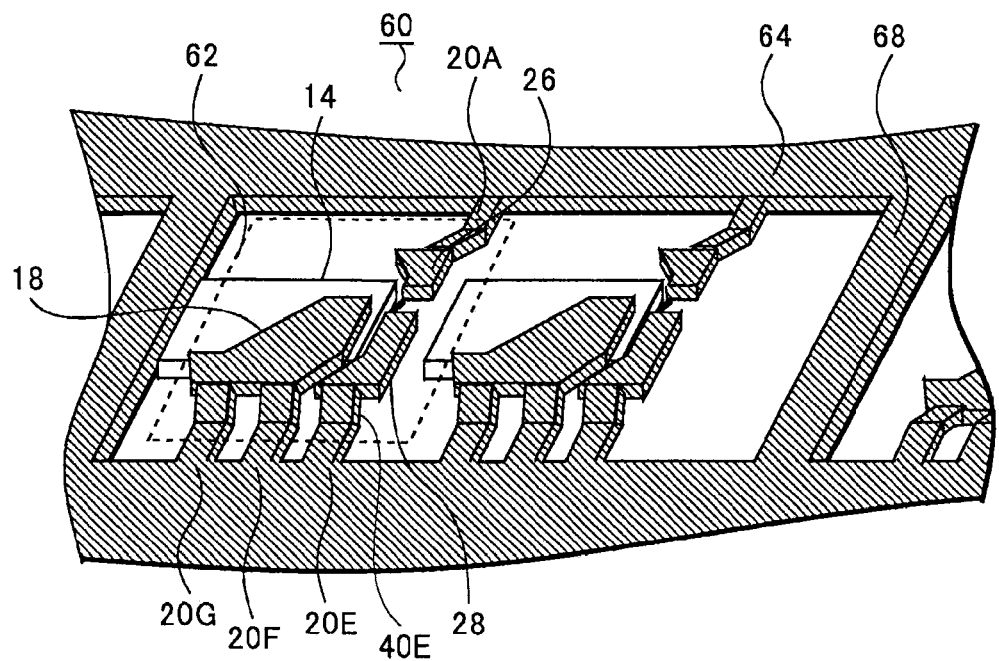
FIG. 10A is a perspective view.
Figure 10B:
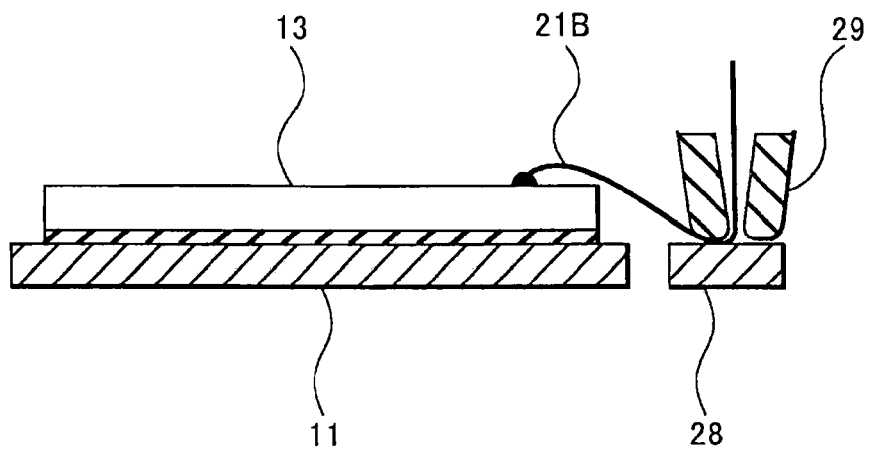
FIG. 10B is a cross-sectional view, for describing the method of manufacturing a semiconductor device according to the present invention.
Figure 11A:
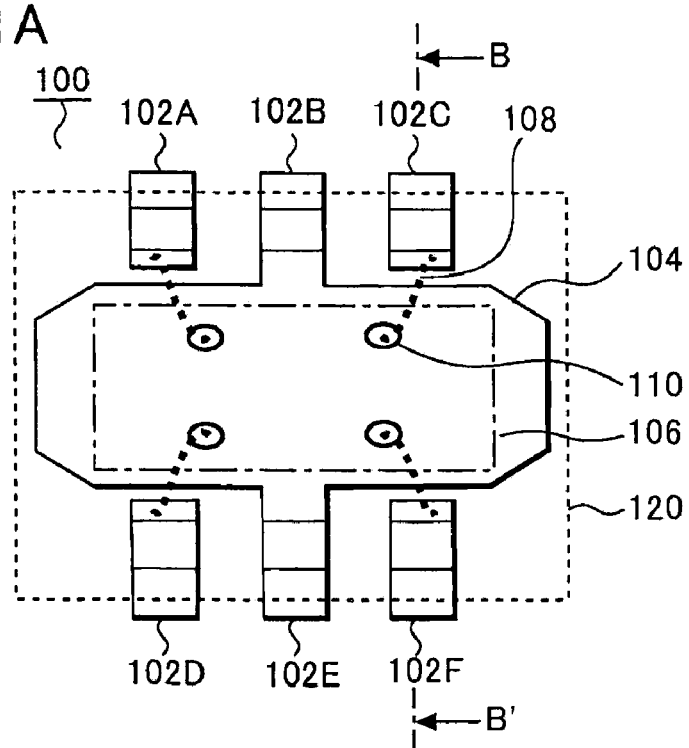
FIG. 11A is a plan view.
Figure 11B:
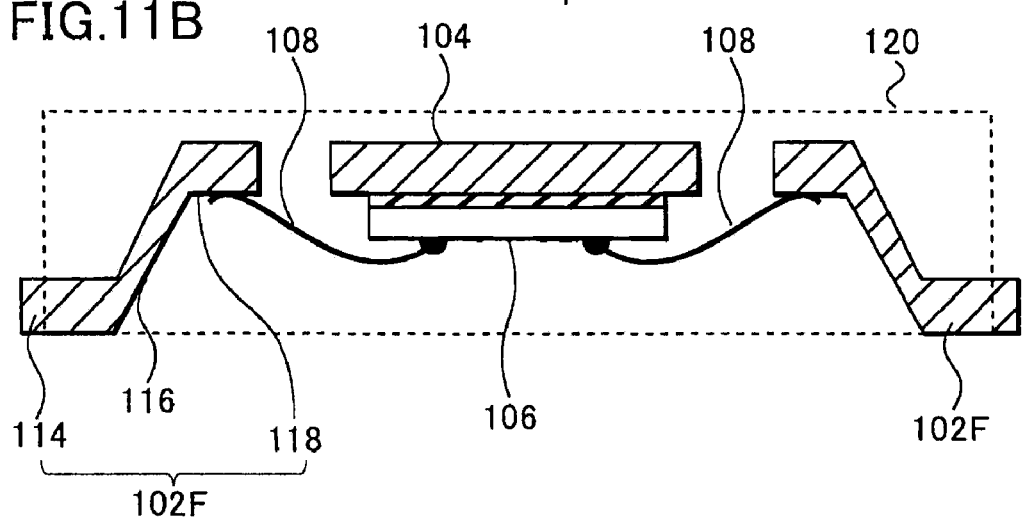
FIG. 11B and FIG. 11C are cross-sectional views, for describing a method of manufacturing a semiconductor device according to a prior art.
Figure 11C:
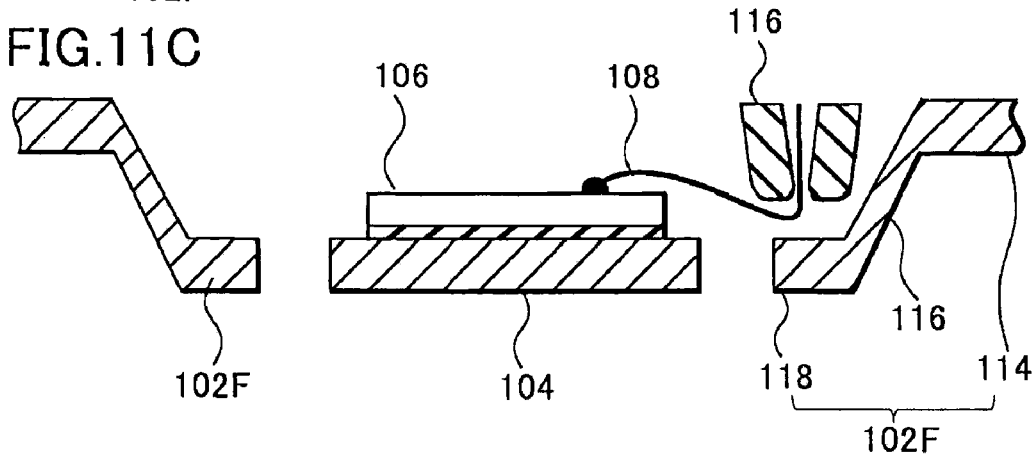

What is claimed is:

1. A semiconductor device:
   which includes a plurality of semiconductor elements disposed by stacking, and leads electrically bonded to the respective semiconductor elements and each having a part exposed to an outside of a sealing resin; and
   in which each of the leads includes an exposure portion exposed to the outside, a bonding portion electrically bonded to the semiconductor elements and positioned on a plane different from where the exposure portion is positioned, and a continuous portion making the bonding portion and the exposure portion continuous,
   the semiconductor device comprising:
   a first island including a first main surface and a second main surface;
   a first semiconductor element mounted on the first main surface of the first island; and
   a first lead extending continuously from the first island to be exposed to the outside;
   a second island including a first main surface and a second main surface which are different from those of the first island;
   a second semiconductor element mounted on the first main surface of the second island; and
   a second lead extending continuously from the second island to be exposed to the outside; and
   a third lead disposed close to a side of the first or the second semiconductor element, the side being different from a side from which the first and second leads are drawn, and bonded to any one of the first and second semiconductor elements via a bonding member.

2. The semiconductor device according to claim 1, wherein the bonding member is a thin metal wire.

3. The semiconductor device according to claim 1, comprising two of the third leads, wherein
   any one of the first semiconductor element and the second semiconductor element is a transistor including a first main electrode on one of the main surfaces used for mounting the semiconductor element while including a second main electrode and a control electrode on the other main surface,
   the bonding portion of the third lead bonded to the second main electrode is formed longer than the bonding portion of the other third lead bonded to the control electrode, and
   the number of the bonding member which bond the third lead to the second main electrode is larger than that of the bonding member which bond the third lead to the control electrode.

4. A semiconductor device:
   which includes a plurality of semiconductor elements disposed by stacking, and leads electrically bonded to the respective semiconductor elements, and each having a part exposed to an outside of a sealing resin; and in which each of the leads includes an exposure portion exposed to the outside, a bonding portion electrically bonded to the semiconductor elements and positioned on a plane different from where the exposure portion is positioned, and a continuous portion making the bonding portion and the exposure portion continuous, the semiconductor device comprising:

a first island including a first main surface and a second main surface;

a first semiconductor element mounted on the first main surface of the first island;

a first lead extending continuously from the first island to be exposed to the outside;

a second island including a first main surface and a second main surface which are different from those of the first island;

a second semiconductor element mounted on the first main surface of the second island;

a second lead extending continuously from the second island to be exposed to the outside;

a third lead bonded to an electrode on the first semiconductor element via a bonding member, and having a bonding portion on the same plane as the first island; and a fourth lead bonded to an electrode on the second semiconductor element via a bonding member, and having a bonding portion on the same plane as the second island, wherein the bonding member for bonding the third lead to the first semiconductor element is drawn sideward from a side of the first semiconductor element, the side being different from a side from which the first lead is drawn, and the bonding member for bonding the fourth lead to the second semiconductor element is drawn sideward from a side of the second semiconductor element, the side being different from a side from which the second lead is drawn.

* * * * *